United States Patent [19]

Schwee

[11] Patent Number: 4,901,278

[45] Date of Patent: Feb. 13, 1990

[54] BLOCH-LINE MEMORY ELEMENT AND RAM MEMORY

[75] Inventor: Leonard J. Schwee, Silver Spring, Md.

[73] Assignee: The United States of America as represented by the Secretary of the Navy, Washington, D.C.

[21] Appl. No.: 54,977

[22] Filed: May 28, 1987

[51] Int. Cl.$^4$ .............................................. G11C 11/14
[52] U.S. Cl. ...................................................... 365/87
[58] Field of Search ............................................ 365/87

[56] References Cited

U.S. PATENT DOCUMENTS

| | | | |
|---|---|---|---|
| 3,176,276 | 3/1965 | Smith | 340/174 |
| 3,710,353 | 1/1973 | Jacobs et al. | 340/173.2 |
| 3,906,466 | 9/1975 | Lo et al. | 340/174 |
| 4,024,515 | 5/1977 | Torok et al. | 340/174 |
| 4,034,359 | 7/1977 | Torok et al. | 340/174 |
| 4,151,606 | 4/1979 | Torok | 365/172 |
| 4,473,893 | 9/1984 | Zierhut et al. | 365/87 |
| 4,587,636 | 5/1986 | Cosimini et al. | 365/87 |

OTHER PUBLICATIONS

NSWC TR 82-568, The Crosstie Random Access Memory, Part II–Initial Test Results, by Paul Hunter, Leonard J. Schwee, Mary T. Shepard, Frank Salton, Jan. 1983.

Journal of Applied Physics-vol. 53, No. 3; Mar. 1982, pp. 2762-2764, copy in 365-87.

*Primary Examiner*—James W. Moffitt
*Attorney, Agent, or Firm*—John D. Lewis; Kenneth E. Walden

[57] ABSTRACT

The present invention relates to a Bloch-line memory element and a nonvolatile RAM memory using such a Bloch-line memory element. The Bloch-line memory element comprises a planar magnetic memory element having magnetic domains separated by a wall which contains a Bloch-line disposed within the individual memory element. Coincident write lines interact with the magnetic element for writing a Bloch-line to a predetermined area within the memory element. For sensing the presence or absence of a Bloch-line within the predetermined area, one write conductor and a sense line are used for determining the logic state of the particular memory element. A plurality of memory elements are disposed in an address matrix and can be selected for reading from or writing to the particular Bloch-line RAM memory element for determining or writing bits of words.

9 Claims, 2 Drawing Sheets

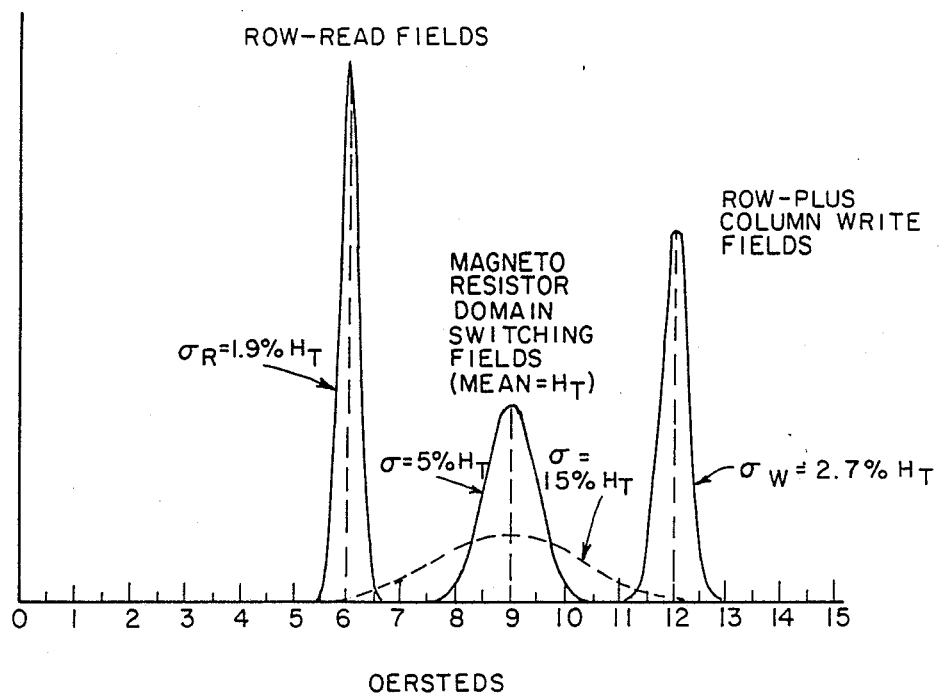
FIG. 1
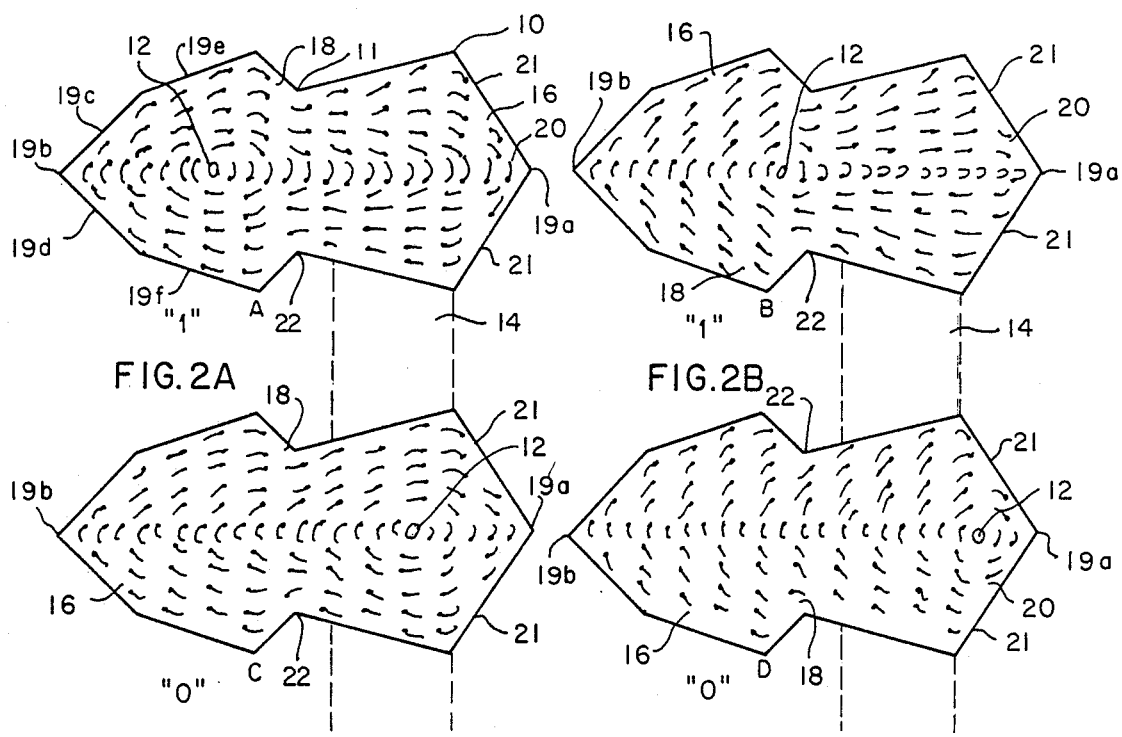
FIG. 2A  FIG. 2B
FIG. 2C  FIG. 2D

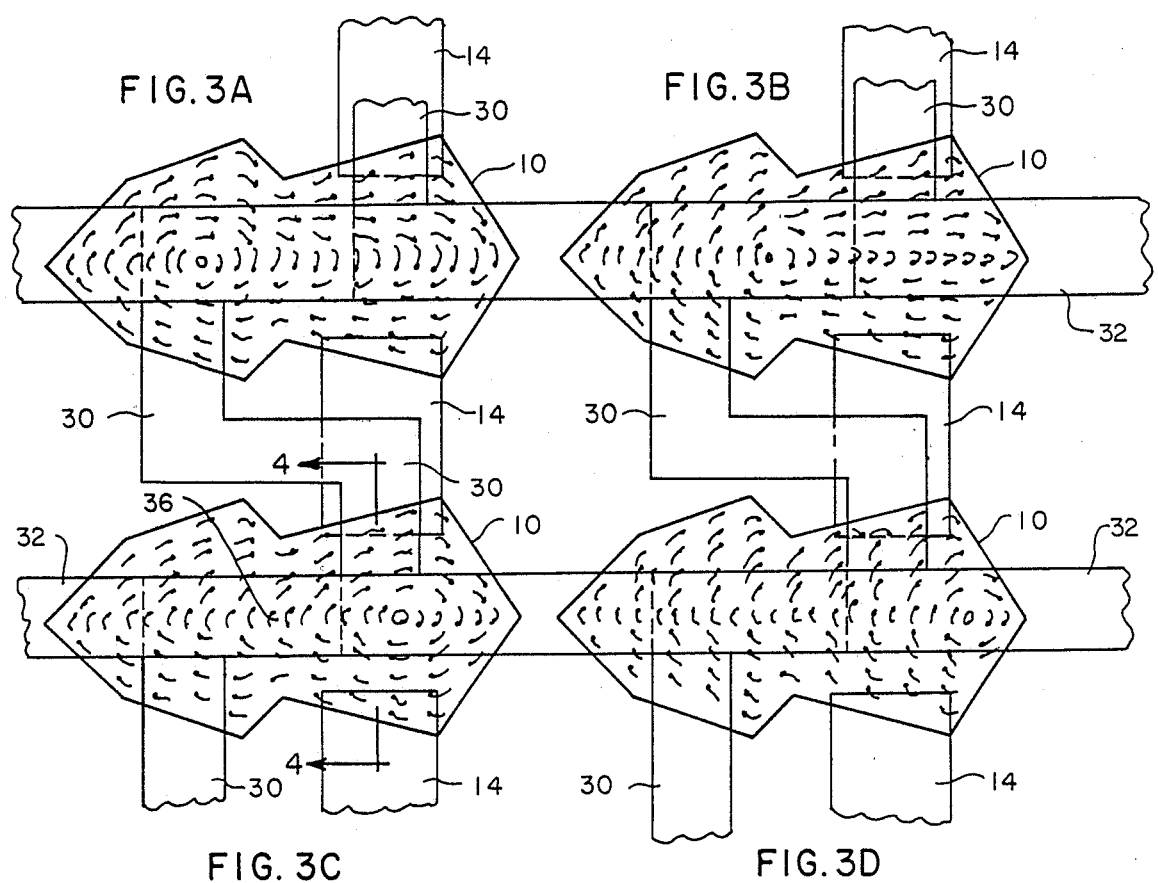
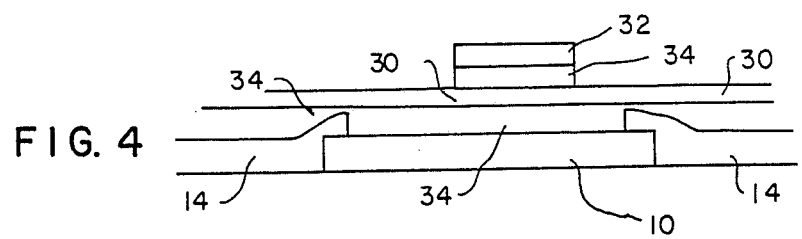
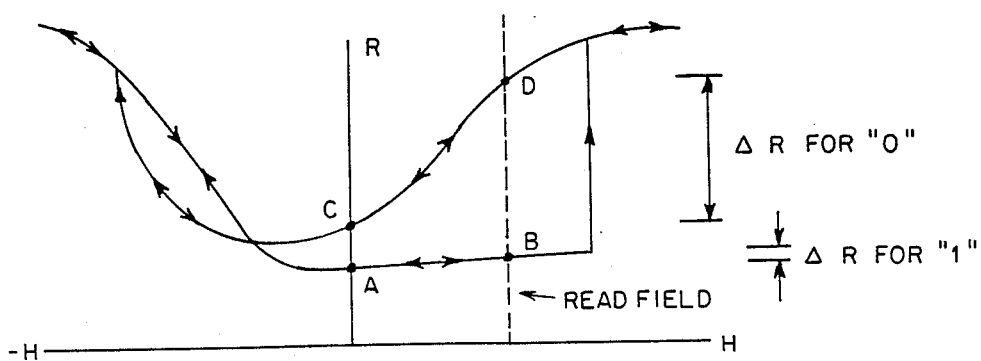

BLOCH-LINE MEMORY ELEMENT AND RAM MEMORY

BACKGROUND OF THE INVENTION

The present invention relates to the storing of a bit of information so that the bit can be read non-destructively, and stored in a nonvolatile manner.

Information is stored in memories in many different ways. Some memories are volatile, that is, the information is lost when the power is turned off. The present memory element is intended to compete with nonvolatile core memories and plated-wire memories. In a plated wire memory, the information is stored in a permalloy (81-19 nickel-iron) coating which is plated onto a fine wire. In a core memory, the bit of information is stored in a toroid of ferrite material. In neither of these memories can the magnetic elements be integrated photolithographically with the drive electronics and decoders. Thus, these memories require much labor to build and cost is high. plated wire costs between $4.00 and $10.00 per bit. Core costs 1 to 2 cents per bit and it does not have a non-destructive readout. A new memory, the Crosstie Random Access Memory (CRAM) is currently being developed. The present memory element is intended to fit into the CRAM configuration but offer better characteristics.

Previously, the CRAM thin magnetic film was deposited on a silicon chip after the drive electronics, decoders, and amplifiers were fabricated. The permalloy film was etched into shapes which allow a crosstie-Bloch line pair to be generated in a memory element when a "one" was stored, and a "zero" was stored when the crosstie-Bloch line pair is absent.

Two conductors, insulated from each other and the permalloy film were used to generate or annihilate the crosstie-Bloch line pairs. The current in the conductors provided a magnetic field at the memory element which was localized. When a current was present in both conductors, the magnetic fields produced by each added up to a field sufficient to generate or annihilate depending on the polarity. The field produced by one conductor is insufficient to generate or annihilate, or switch the film. This type of addressing is called half-addressing, or half selecting. This is a misnomer however, because in reality two thirds of the switching field is needed in each conductor. With a small statistical distribution present for the currents, and a small statistical distribution allowed in the switching fields, the memory can be workable. The allowed distributions are shown in FIG. 1. The standard deviation, $\sigma$, for the switching field of the magnetic memory elements must be no larger than 5% of the switching field if acceptable yields are expected in the manufacture of chips. FIG. 1 shows that a $\sigma$ of 15% is too large even for small memories, because some elements would be written unintentionally by the read field and not written by the write fields. The yield drops off precipitously for a $\sigma$ larger than 5%. Thus, using the normal crosstie-Bloch line pair for the memory element, it is difficult to consistantly achieve a $\sigma$ of less than 5%. The Bloch-line memory element of the present invention allows the 5% standard deviation to be much more readily obtained.

Accordingly, it is an object of the present invention to provide a Bloch-line memory element and a nonvolatile RAM memory using a Bloch-line memory element.

Further objects and advantages of the present invention will become apparent as the following description proceeds and features of novelty characterizing the invention will be pointed out with particularity in the claims annexed to and forming a part of the specification.

SUMMARY OF THE INVENTION

Briefly, the present invention relates to a Bloch-line memory element and a nonvolatile RAM memory using such a Bloch-line memory element. The Bloch-line memory element comprises a planar magnetic memory element having magnetic domains separated by a wall which contains a Bloch-line disposed within the individual memory element. Coincident write lines interact with the magnetic element for writing a Bloch-line to a predetermined area within the memory element. For sensing the presence or absence of a Bloch-line within the predetermined area, one write conductor and a sense line are used for determining the logic state of the particular memory element. A plurality of memory elements are disposed in an address matrix and can be selected for reading from or writing to the particular Bloch-line RAM memory element for determining or writing bits of words.

DESCRIPTION OF THE DRAWINGS

For a better understanding of the present invention reference may be had to the accompanying drawings wherein:

FIG. 1 is a graph of the statistical distribution for X-Y coincidence half-addressing.

FIGS. 2A-2D show Bloch-line dynamic nonvolatile memory elements of the present invention.

FIGS. 3A-3D shows the arrangement of the Bloch-line elements and the position and arrangement of the write and read lines.

FIG. 4 shows in cross-section the Bloch-line elements and the write-read lines taken along section 4—4 of FIG. 3.

FIG. 5 is a graph showing the magnetoresistive characteristic for the reading of the Bloch-line memory element of FIGS. 2A-2D.

DETAILED DESCRIPTION OF THE PREFERRED EMBODIMENT

Reference will now be made to the drawings wherein like reference numerals have been applied to like members.

The memory element of the present invention uses a Bloch-line and only a Bloch-line to store information. The crosstie is eliminated and none are present. By forcing the magnetization in a magnetic element to follow the proper directions, a Bloch-line must appear. The magnetic element is a planar film of permalloy as known in the prior art and is shown in FIGS. 2A-2D where each of FIGS. 2A-2D shows the Bloch-line 12 in a different location within the magnetic element. Many shapes 10 have been tried in various sizes ranging from $8\mu$ across the neck 11 to $16\mu$. They all work but at slightly different magnetic field strengths. The magnetization illustrated in FIGS. 2A and 2C illustrates two ground states with no field applied. If the Bloch-line 12 is on the left of the nonmagnetic conductor 14 it is considered to be a "one" as shown in FIGS. 2A and 2B. If Bloch-line 12 is on the right side or within conductor path 14, it is considered to be a "zero" as shown in FIGS. 2A and 2D, respectively.

Shape 10 has two stable states. The magnetization does not normally end up in one of these two states when the film is etched into these shapes. The elements must be initialized by applying two external fields. An arbitrarily large field (larger than 300 Oe) can be applied upward on the element and reduced to zero. The magnetization lines line up parallel to the edges with no field applied to avoid creating external fields which require energy. After the field is reduced to zero, the magnetization for the left three quarters area 18 of each element is as shown in FIGS. 2A–2D. But the magnetization is oriented wrong at the tail 20 (the right side). Thus two domains result. A second field (about 30 Oe) is then applied downward. The resulting magnetization is as shown in FIGS. 2A–2D described in the when the second field is reduced, to zero. Thus two fields are required to initialize the memory elements. In other words, after fabrication, the chips will go through two oppositely directed fields to be initialized. After that, all fields are applied on the chip.

The shape element 10 is formed to set up the particular magnetic configuration, i.e., it is desirable to have the magnetization of each element pointing in the same clock-wise or counter clock-wise direction. The angles of the edges are important for setting up the directions of magnetization which force a Bloch-line to be present. Shape 10 is shaped similar to a ten-sided bi-directional barbed arrow head symmetrical about a longitudinal axis, having a first and second end along the longitudinal axis, one of the ends being more pointed than the other end, having a waist or neck 11 disposed approximately at the middle of the shape along the longitudinal axis, as shown, and having the sense or read line disposed between neck 11 and a blunt end 19a of shape element 10 in contrast to the more pointed end 19b.

In an alternate embodiment boundaries 19, c, d, e, and f, can be configured into two straight lines comprising 19d, f and 19c, e for making the more pointed end 19b and thus, an 8 sided configuration. However, such configuration will take up more space on the chip than the configuration shown. Likewise, a properly shaped configuration of more than 10 sides can be devised. However, it is thought the 10 sided configuration shown in FIGS. 2A–2D to be optimal.

the read field generated in the row conductor is two thirds of the field required to move the Bloch line from its left stable position in area 18 past neck 11, to the right position in area 20. The read field changes the magnetization as shown in FIG. 2B if the element 10 was in the "one" state. If element 10 was the "zero" state, as shown in FIG. 2C, the read field just moves the Bloch-line a small distance toward the blunt boundary 21 as shown in FIG. 2D. When both write conductors 30, 32 shown in FIGS. 3A–3D are carrying currents, the field applied is 4/3 the field required to move the Bloch line 12 through the neck or constriction 11. This would be a write operation.

Referring now to FIGS. 3A–3D there is shown the write conductors and the read conductors and their relationship with the respective shape elements 10 of FIGS. 2A–2D. All conductors are composed of conductive but nonmagnetic material. There are two write conductors, 30 and 32 which are insulated from each other and from the element 10 by insulators 34 (FIG. 4). Write line 32 runs across a row of shape elements 10, and write line 30 is a meandering shape connecting the columns of elements 10. Write line 30 deviates from the straight column travel and hence the meandering, in order to be spatially coincident with line 32 in area 36. It is in area 36 wherein writing is accomplished with each of the half or less than full write capability have reenforcing fields in order to write to the selected element 10 as determined by external address circuitry for selection of the selected element 10 within an address matrix in a RAM matrix. FIG. 4 shows the spatial relationships in cross-section of write conductors 30, 32, sense or read line 14, and one of the shape elements 10.

To read out the information, a current is passed as illustrated in FIGS. 2, 3, and 4 through the row/column of memory elements. A sense or read current is passed through conductor 14 including the selected element 10, in order to read the resistance of the row/column. A read current is then sent through write lead 32 which is obviously less than the full select current so that the state of the selected element 10 does not change when being read. The changing electrical resistance of selected [element] element 10 [changes in the selected elements] with rotation of the magnetization due to magnetoresistive effects is shown in FIG. 5. If the magnetization is parallel to the current driven through addressed element 10 the resistance is two to three percent higher than if the current is perpendicular to the magnetization. This is a magnetoresistance effect. Such changes in resistance are typically sensed by a Wheatstone bridge or other appropriate means. The changes in resistance are illustrated in the H-R curve shown in FIG. 5. The H-R curve shows the resistance to be expected for the situations shown in FIGS. 2A–2D which are indicated on the H-R curve as A, B, C, and D, respectively. If a "zero" was stored as in FIGS. 2C–2D, a large change in resistance ΔR results as indicated by the change in R between points C and D in FIG. 5. If a "one" was stored as in FIGS. 2A–2D, a small change occurs R occurs as indicated by the change in ΔR between points A and B in FIG. 5. About twice the signal can be obtained from these elements compared to the crosstie elements. The abrupt changes in resistance occur when the Bloch-line swiftly moves through the constriction neck 11 changing from a "one" to a "zero" or vice-versa. The memory element does not change state when it is read out since the read current is less than full select, the readout is non-destructive.

Thus, the cell or element can be written to in a dynamic manner but unlike a magnetic core memory, the readout is nondestructive and the state of the element does not have to be rewritten into the element as is the case for a magnetic core memory.

These memory cells can be arranged in a standard address matrix as with other types of memory, static or dynamic with appropriate addressing logic in order to read or write from the memory. The disclosed cells can be produced by photolithographic techniques with metallic deposition of the appropriate conductor pattern in a manner known in the art.

While there has been illustrated and described what is at present considered to be a preferred embodiment of the present invention, it will be appreciated that numerous changes and modifications are likely to occur to those skilled in the art and it is intended in the appended claims to cover all those changes and modification which fall within the true spirit and scope of the present invention.

I claim:

1. A random access bi-stable Bloch-line memory element having a standard deviation of the switching field below 5 percent comprising:

a discrete planar magnetic memory element having magnetic configuration consisting of a movable bi-stable Bloch-line disposed within the memory element whereby a one or a zero is specified depending on the location of the Bloch-line;

write means coupled to the memory element for applying a magnetic field to a predetermined portion of the memory element; and read means for determining whether the movable bi-stable Bloch-line is disposed within the predetermined portion of the memory element.

2. The Bloch-line RAM element of claim 1 wherein the write means and the read means further comprise the spatial conjunction of a pair of matrix conductors, each having less than a full address/select capability and at least a half address/select capability.

3. The Bloch-line RAM element of claim 2 wherein the magnetic layer is placed below the leads of the write/read means.

4. The memory of claim 1 wherein the memory elements are electrically disposed within a matrix and the read means and the write means are addressable for selection of a specific memory element.

5. A random access memory system having a standard deviation of the switching field below 5 percent in which binary data is individually stored as a bi-stable Bloch-line within a predetermined portion of the memory of the memory element, , bounded by write/read means with the read means further comprising magneto-resistive determination of the presence of or absence of the Bloch-line within the predetermined portion of the memory element, and the read/write means further comprising two or more spatially conjunctive leads each having less than full write capability and each being individually addressable in a matrix array.

6. A random access bi-stable Bloch-line memory system having a standard deviation of the switching field below 5 percent comprising:

XY discrete memory elements arranged electrically in an X row, Y column matrix array, each memory element formed a magnetizable material having a bi-stable Bloch-line formed therein ;

a plurality of discrete low resistance coupling elements serially electrically coupling Y discrete memory elements for forming Y discrete memory elements per memory column;

column/row read means for coupling a column read current to a selected one of said Y memory columns, said column read current signal serially flowing through said discrete low resistance electrically intercoupling elements and said electrically intercoupled X discrete memory elements therebetween as determined by selection means; and readout means coupled to the one selected memory element at the intersection of the one selected row line and the one selected memory column for determining by circuit electrical resistance and the presence or absence of a Bloch-line disposed within the sensing area on the discrete memory element.

7. A Bloch-line random access memory system having a standard deviation of the switching field below 5 percent with the capability of writing data in and nondestructively reading data out, comprising:

a memory including a plurality of juxtaposed columns of memory cells arranged in an array having a plurality of juxtaposed rows of conductors operatively connected to a plurality of juxtaposed columns of conductors for writing into the memory cells and reading out of the memory cells logic "ones" and logic "zeros" wherein the presence of a bi-stable Bloch-line in a predetermined sensing area of the memory element corresponds to one of the logic states and the absence of the Bloch-line within the predetermined sensing area corresponds to the other of the logic states;

row means operatively connected to the plurality of juxtaposed rows of conductors for selecting and driving a particular one thereof during a write or read operation based on a predetermined address;

column means operatively connected to the plurality of juxtaposed columns of conductors and the plurality of juxtaposed columns of memory cells for selecting and driving a particular one of the juxtaposed meandering columns of conductors during a write operation or a read operation based on a predetermined address;

said row means and said column means cooperating during the write operation to generate coincident drive currents the polarities and amplitudes of the drive currents depending on whether a logic "zero" or a logic "one" is to be written, and said column means cooperating during the read operation to enable a current flow through the particular selected one of the memory elements; and data readout means the input of which is operatively connected to the plurality of juxtaposed columns of memory cells of said memory element such that when the particular one of the plurality of juxtaposed columns of memory cells is selected and the particular one of the plurality of juxtaposed rows of conductors is selected, the logical contents of memory cell at that location is read by determination of the electrical resistance of the cell depending on the presence or absence of a Bloch-line within the sensing area of the memory element.

8. A random acces bi-stable Bloch-line memory having a switching field standard deviation below 5 percent comprising:

a planar element made of permalloy material, said planar element being shaped similar to a ten-sided bi-directional barbed arrowhead symmetrical about a longitudinal axis and having a first and second end along the longitudinal axis with one of said ends being more pointed than the other, and having a constriction across the width disposed approximately at the middle of the shape along the longitudinal axis and means for reading and writing to said memory element.

9. The random access memory element of claim 8 wherein a plurality of said elements are disposed in an addressable memory matrix.

* * * * *